United States Patent [19]

Murase et al.

[11] Patent Number: 4,982,274

[45] Date of Patent: Jan. 1, 1991

[54] HEAT PIPE TYPE COOLING APPARATUS FOR SEMICONDUCTOR

[75] Inventors: Takashi Murase, Yokohama; Suemi Tanaka, Nishinomiya, both of Japan

[73] Assignee: The Furukawa Electric Co., Ltd., Tokyo, Japan

[21] Appl. No.: 284,072

[22] Filed: Dec. 14, 1988

[51] Int. Cl.$^5$ .............................................. H01L 25/04
[52] U.S. Cl. ...................................... 357/82; 357/81; 165/104.33
[58] Field of Search ................ 357/81, 82; 165/104.33

[56] References Cited

U.S. PATENT DOCUMENTS

| | | | |
|---|---|---|---|
| 3,437,132 | 4/1969 | Venema | 357/82 |
| 4,675,783 | 6/1987 | Murase et al. | 357/82 |

FOREIGN PATENT DOCUMENTS

| | | | |
|---|---|---|---|
| 3709006C | 7/1988 | Fed. Rep. of Germany | 165/104.33 |
| 55-156350 | 12/1980 | Japan | 357/82 |
| 56-108098 | 8/1981 | Japan | 165/104.33 |
| 56-122152 | 9/1981 | Japan | 165/104.33 |
| 60-57956 | 4/1985 | Japan . | |

Primary Examiner—Rolf Hille
Assistant Examiner—Steven Loke
Attorney, Agent, or Firm—Frishauf, Holtz, Goodman & Woodward

[57] ABSTRACT

A heat pipe type cooling apparatus for a semiconductor, comprises a plurality of first copper pipes, each of the first pipes having a plurality of V-shaped grooves formed in an inner surface thereof and arranged in a circumferential direction thereof, and a plurality of second copper pipes, each of the second pipes having a plurality of second grooves formed in an inner surface thereof, each of the second grooves having an opening narrower than an inner part thereof. A plurality of ceramic pipes connect the first pipes and the second pipes, through intermediate pipes made of a nickel-iron alloy. One end of each of the second pipes is inserted in a metal block on which a semiconductor is mounted.

16 Claims, 5 Drawing Sheets

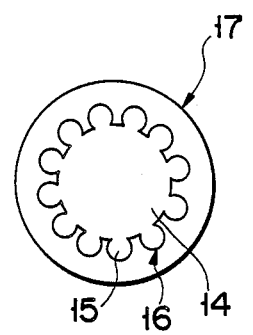
F I G. 2C
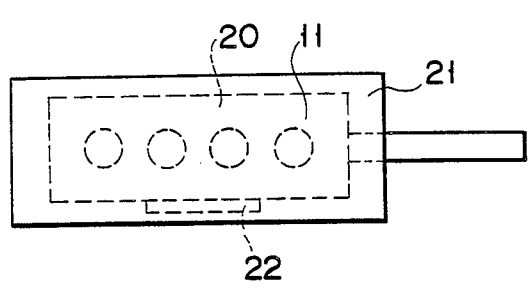
F I G. 2D
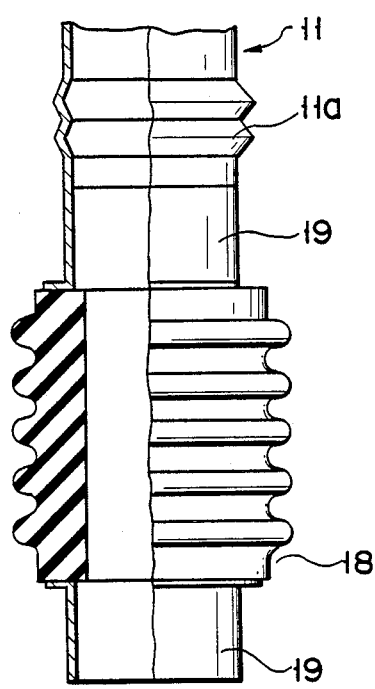
F I G. 2E

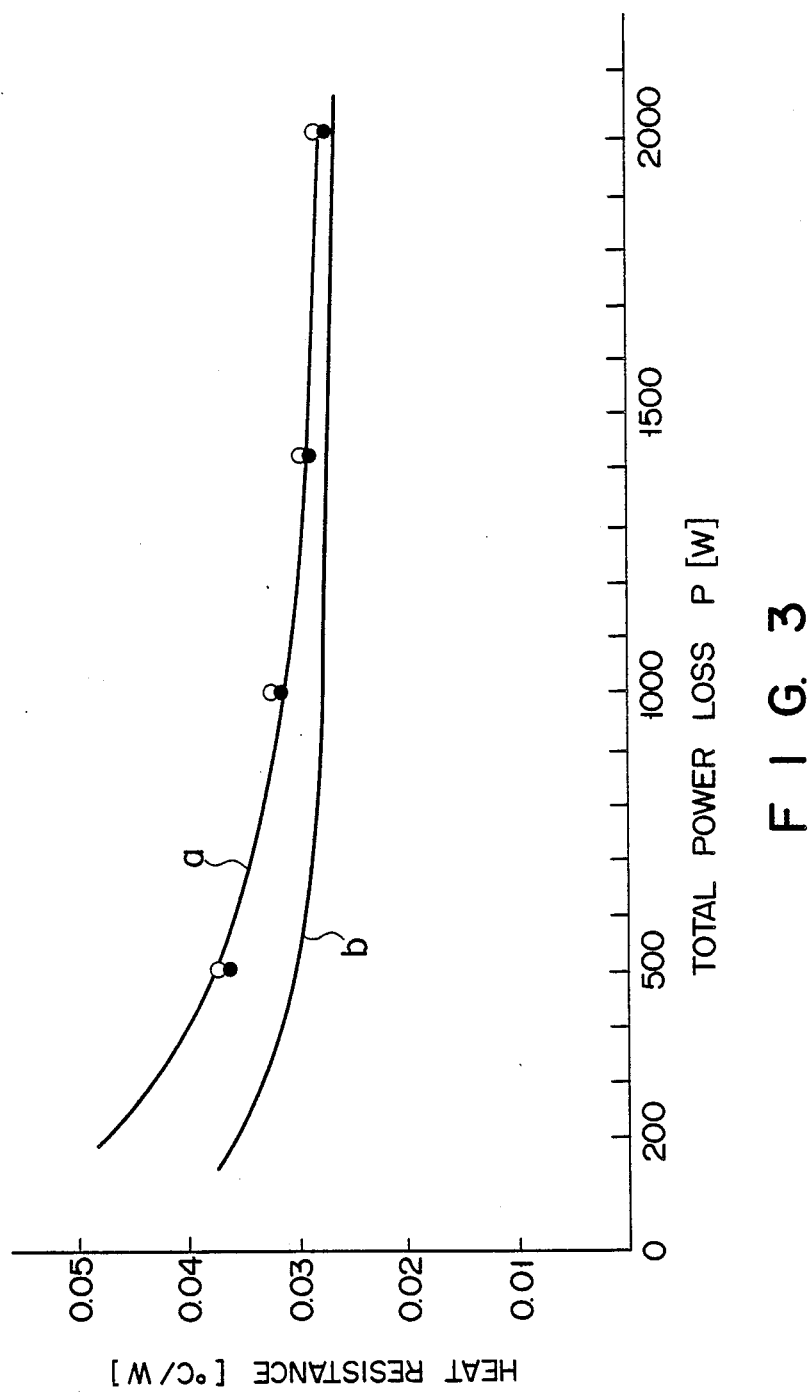
F I G. 3

HEAT PIPE TYPE COOLING APPARATUS FOR SEMICONDUCTOR

BACKGROUND OF THE INVENTION

1. Field of the Invention

The present invention relates to a heat pipe type cooling apparatus for semiconductors.

2. Description of the Related Art

As disclosed in Japanese Patent Disclosure (Kokai) No. 60-57956 by the present inventors, a cooling apparatus for cooling power semiconductors such as a thyristor by using a heat pipe is already known. As shown in Figs. 1A and 1B, in this heat pipe type cooling apparatus for semiconductors, fins 2, each of which is made of a metal, such as aluminum or copper, having a high thermal conductivity, extend from heat pipes 1, each of which is made of a metal, such as copper, having a high thermal conductivity so as to constitute a heat dissipation portion. The lower ends of the heat pipes are inserted in metal block 3 made of a metal, such as copper or aluminum, having a high thermal conductivity. With this arrangement, loss heat from semiconductor 4 such as a thyristor attached to the metal block is transferred to the heat pipes, and is cooled down naturally or forcibly by a fan through the fines, thereby increasing efficiency of the semiconductor. Terminal 5 for extracting a current is attached to the block as needed. Since a surface of a semiconductor such as a thyristor generally has a potential, a current flows to the heat dissipation portion through the metal heat pipes. Therefore, handling of the heat pipe type cooling apparatus is dangerous depending on operating conditions. Especially, since such an apparatus is often mounted in a vehicle such as a train and used as a cooling apparatus for an inverter thyristor, a problem of electrical safety is inevitably posed. For this reason, an insulating plate made of a ceramic material, such as aluminum nitride, having a relatively high thermal conductivity is arranged between the semiconductor such as a thyristor and the metal block so as to perform electrical insulation. However, the above aluminum nitride insulating plate poses problems in terms of thermal performance, withstand voltage function, mechanical strength, reliability, and the like.

SUMMARY OF THE INVENTION

It is an object of the present invention to provide a heat pipe type cooling apparatus which can prevent a current from flowing to a heat dissipation portion and is excellent in thermal performance, mechanical strength, and reliability.

According to the present invention, there is provided a heat pipe type cooling apparatus for a semiconductor, comprising a plurality of first metal pipes which extend substantially parallel to each other, and one end of each of which is open, each of the first metal pipes having a plurality of first grooves formed in an inner surface thereof, each of the first grooves having an opening broader than an inner part thereof, a plurality of second metal pipes which extend substantially parallel to each other, one end of each of which is closed and the other end of each of which is open, each of the second metal pipes having a plurality of second grooves formed in an inner surface thereof, each of the second grooves having an opening narrower than an inner part thereof, a plurality of electrically insulating pipes, each connecting one end of each of the first metal pipes to the other end of a corresponding one of the second metal pipes so as to allow the first and second metal pipes to communicate with each other, a conductive block to which one end of each of the second metal pipes is connected and a semiconductor is attached, and an electrically insulating working liquid supplied into the metal pipes.

Said insulating pipes for connecting the first and second metal pipes are constituted by electrically insulating pipes each made of an inorganic material such as alumina, magnesia, glass, ceramic, and the like.

Both the heat dissipation and absorption portions of the metal pipes may be made of a metal having a high thermal conductivity, such as copper and aluminum. The grooves each having an opening and a hollow portion therein are formed in the inner surface of each second metal pipe, so that the working liquid may flow into the hollow portion from the opening, and is heated, so that core boiling occurs, and the liquid is evaporated upon generation of bubbles. In this case, the core boiling is promoted because of the narrow opening and broad hollow portion, and hence evaporation of the working liquid is also promoted. In addition, since V-shaped grooves are formed in the first metal pipe, convection of the working liquid is accelerated while the surface area is increased and a condensation effect is enhanced. The number of the grooves is determined according to the property of working liquid. It is preferable that each metal pipe constituting the heat dissipation portion has an upper end tapered in a hemispherical or conical shape, and has a nozzle at its distal end. With this arrangement, the V-shaped grooves are formed in the inner surface of each metal pipe so as to extend to its end portion, and hence efficiency as a heat pipe can be increased. The nozzles formed at the ends of the metal pipes are used to supply the working liquid. The lower end of each second metal pipe is preferably tapered in a hemispherical or conical shape. With this arrangement, similar to the heat dissipation portion, the grooves formed in the inner surface of the metal pipe extend to its end portion, thus increasing evaporation efficiency.

According to the heat pipe type cooling apparatus for a semiconductor of the present invention, the heat pipes may be vertically or horizontally arranged. Especially, if they are horizontally arranged, since the grooves are formed in the inner surfaces of the metal pipes and these grooves effectively function as wicks, the heat dissipation characteristics can be improved.

BRIEF DESCRIPTION OF THE DRAWINGS

FIGS. 1A and 1B show a conventional heat pipe cooling apparatus, in which FIG. 1A is a front view and FIG. 2B is a sectional view;

FIGS. 2A to 2F show a heat pipe cooling apparatus according to an embodiment of the present invention, in which FIG. 2A is a front view, FIG. 2B is a sectional view taken along line 2B—2B of FIG. 2A, FIG. 2C is a sectional view taken along line 2C—2C of FIG. 2A, FIG. 2D is a plan view, FIG. 2E is a partially cutaway side view showing an insulating pipe connecting a first metal pipe to a second metal pipe and FIG. 2F is a partially cutaway perspective view of a part of a first metal pipe;

FIG. 3 is a graph showing a measurement result of characteristics of the apparatus according to the embodiment.

DETAILED DESCRIPTION OF THE PREFERRED EMBODIMENT

Figure 1A:
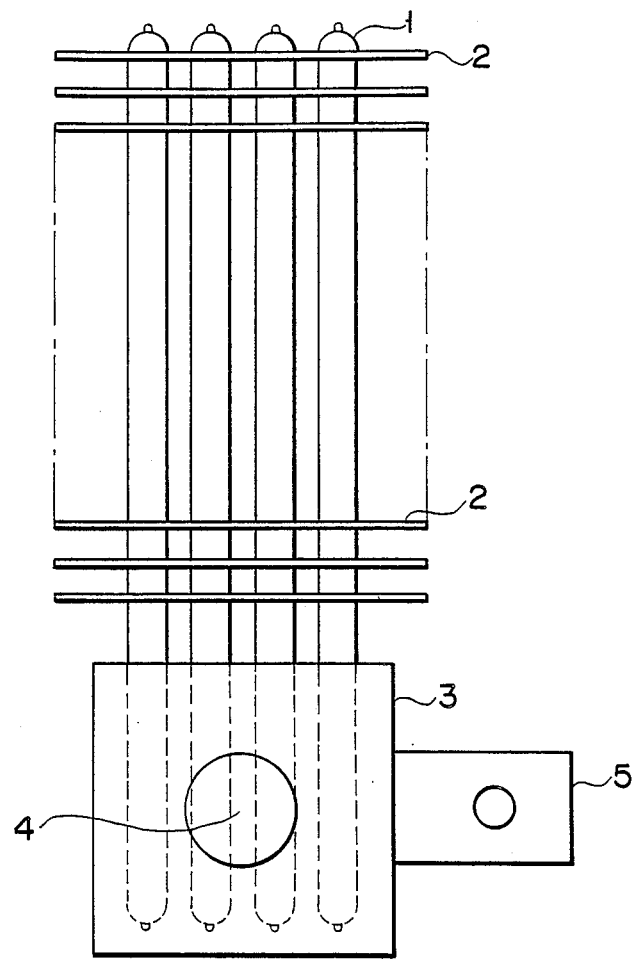
Figure 1B:
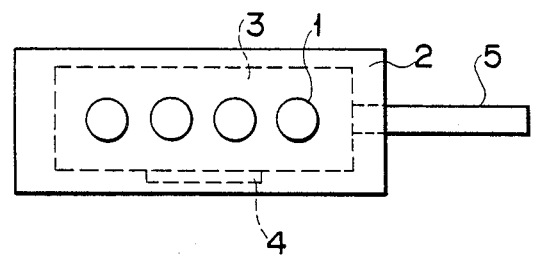
Figure 2A:
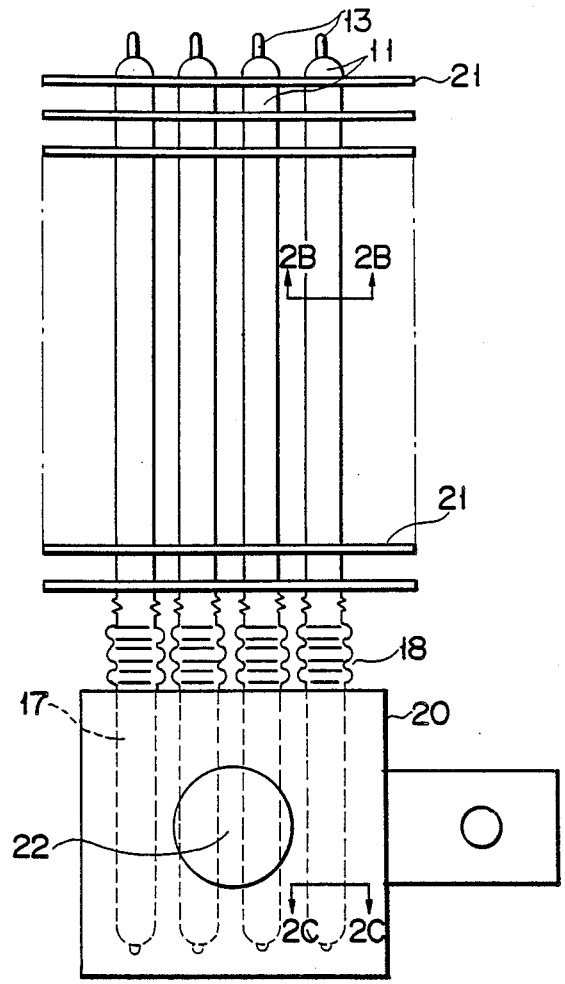
Figure 2B:
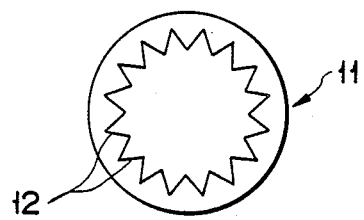
Figure 2F:
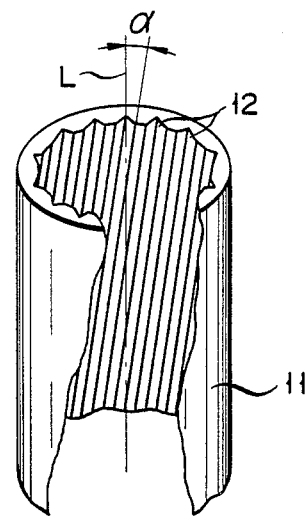

A cooling apparatus according to an embodiment of the present invention and a method of manufacturing the same will be described below with reference to FIGS. 2A to 2F. The upper end portion of each metal pipe 11 made of such as copper and having an outer diameter of 15.88 mm is formed into a hemispherical shape by spinning. Pipe 11 has an inner surface in which a large number of V-shaped linear grooves 12 inclined against the axial direction L of pipe 11 by a small angle $\alpha$ are formed at a depth of 0.3 mm and a pitch of 0.6 mm in the circumferential direction by plug drawing. The inclined angle $\alpha$ is preferably 2~10° and more preferably 3~7: The hemispherical end portion is further processed by spinning so as to form nozzle 13 having a small hole. With this process, first metal pipe 11 constituting a heat dissipation portion is formed. Subsequently, a large number of V-shaped linear inclined grooves are formed in the inner surface of another metal pipe made of copper at a depth of 1.0 mm and a pitch of 1.5 mm by plug drawing. Thereafter, grooves 16, each of which has opening 14 and hollow portion 15 located therein and having a larger diameter than opening 14, are formed in the grooves at a depth of 0.65 mm and a pitch of 1.5 mm by plug drawing using a spherical plug. Similarly, the lower end of the pipe is formed into a hemispherical shape by spinning, and is sealed by welding, thereby manufacturing second metal pipe 17.

The lower end, i.e., the opening end, of first metal pipe 11 is connected to the upper end, i.e., the opening end, of second metal pipe 17 by using electrically insulating pipe 18. In this embodiment, as shown in FIG. 2E, intermediate pipes or flanged tube 19 made of a material having a similar heat-expansion coefficient to the material of insulating pipe 18 such as a 42Ni-Fe68 alloy or koral are brazed to both the ends of insulating pipe 18 in advance. Metal pipes 11 and 17 are respectively brazed to intermediate pipes 19. This insulating pipe is made of a ceramic material such as $Al_2O_3$. When two metal pipes 11 and 17 are connected to each other in this manner, a heat pipe assembly is formed.

Subsequently, one end portion of each heat pipe assembly, which has a length of 120 mm, is inserted into a corresponding one of four blind holes formed in one end surface of metal block 20 made of copper or aluminum, by drilling, and is brazed to block 20 using a soft brazing material, thereby forming a heat absorption portion. The blind hole of metal block 20 may be alternately made by forming a through hole in metal block 20 and then packing one end of the through hole with a plug. A working liquid having an electrically insulation properties, such as Freon, is supplied from nozzle 13 at the upper end of metal pipe 11. Nozzle 13 is then caulked by a pressing jig and its upper end is sealed by TIG welding in a liquid-tight state.

In the embodiment, each first metal pipe 11 has bellowslike elastic portion 11a near insulating pipe 18, as shown in detail in FIG. 2E. This arrangement can prevent damage to the connected portions of the metal pipes due to vibrations when this apparatus is used in a vehicle. Elastic portion 11 May be formed by bending part of metal pipe 11 or by attaching an elastic portion formed by bending to metal pipe 11. A large number of aluminum fins 21 are then formed on an upper portion of the metal pipe so as to constitute a heat dissipation portion.

The heat pipe cooling apparatus for semiconductors manufactured in this manner has the following structure. A large number of fins extending from metal pipe 11 constitute the heat dissipation portion, metal pipes 17 inserted into metal block 20 constitute the heat absorption portion, and metal pipes 11 and 17 are connected to each other through electrically insulating pipes 18.

A loss heat generated by semiconductor 22 such as a thyristor attached to metal block 20 is transferred to each metal pipe 17 through metal block 20, and is dissipated by the heat dissipation portion of metal pipes 11. In this case, since insulating pipes 18 are respectively arranged between metal pipes 11 and 17, the heat dissipation portions are electrically insulated, and hence only the heat is transferred, thus eliminating the danger of an electrical shock. In addition, since an electrically insulating liquid is used as the working liquid, safety operation can be ensured. Heat dissipation performance is increased because of the V-shaped grooves formed in the inner surface of each first metal pipe 11 of the heat dissipation portion as shown in the cross sectional view of FIG. 2B. In addition, heat absorption performance is increased because of openings 14 formed in the inner surface of each second metal pipe 17 of the heat absorption portion and grooves 16 having hollow portions 15, which are formed deep inside openings 14.

FIG. 3 shows a result obtained by checking characteristics of the above-described cooling apparatus of the present invention and of a comparative example which has the similar construction and dimensions to the embodiment except that each second metal pipe has the same V-shaped grooves as those of first metal pipe.

In this test, two cooling apparatuses were used as a pair, and a thyristor having a post diameter of 75 mm was vertically inserted into each cooling apparatus. Then, heat dissipation performance (heat resistance) was checked by operating each thyristor at a power loss (loss heat) of 200 to 2,000 W while cooling each apparatus at a wind velocity of 3 m/s at the front surface.

In the embodiment (curve a) (having different grooves in the heat dissipation and absorption portions), it was apparent, as shown in FIG. 3, that the heat dissipation performance was improved as compared with the comparative example having identical grooves in both the portions (it was found that the heat dissipation performance was improved especially during a low heat flux of 500 W or less, i.e., during a low power loss period). During a low power loss period of 500 W (2.27 W/cm2), the heat resistance was decreased by 18.9%, i.e., from 0.037 to 0.03° C/W (the heat dissipation performance was increased). The heat resistance was decreased by 25.5%, i.e., from 0.047 to 0.035° C/W at 200 W (0.91 W/cm²).

In the above-described embodiment, accurately V-shaped grooves are formed in first metal pipes 11. However, the present invention is not limited to this arrangement as long as the sectional area of the opening of each groove is larger than that of any other part thereof. In contrast to this, any groove can be formed in second metal pipe 17 as long as it has a portion having a larger sectional area than its opening, i.e., as long as it is narrowed at its opening.

Figure 4:
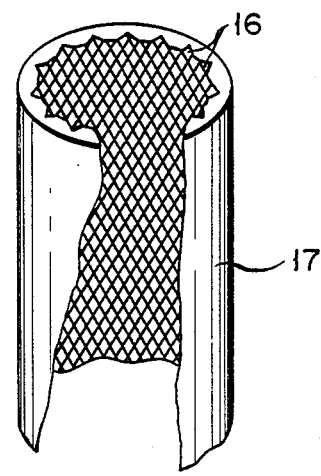
FIG. 4 is a partially cutaway perspective view of a part of a modified second metal pipe.

FIG. 4 shows a modification of a second metal pipe 17 in which V-shaped grooves 16 are formed in the inner surface of the pipe 17 to cross with one another, so that a number of boiling cores may be increased and each boiling core may be small.

According to the present invention, even if a semiconductor such as a thyristor is directly attached to a surface of the metal block, the potential of the thyristor is not transferred to the heat dissipation portion because an intermediate portion of each heat pipe is electrically insulated. Therefore, only heat is transferred to the heat dissipation portion, and hence an electric shock can be prevented. In addition, since the semiconductor can be directly attached to the metal block, thermal performance can also be improved.

Furthermore, grooves having a shape for promoting condensation characteristics are formed in the inner surface of each metal pipe at the fin-formed portion, whereas special or linear grooves or a porous surface suitable for promoting boiling characteristics is formed in the inner surface of each metal pipe of the heat absorption portion (a thyristor mounting portion). Therefore, the heat dissipation and absorption characteristics can be greatly improved. As a result, a small apparatus can be realized.

Moreover, since the end portion of each metal pipe is formed into a hemispherical or conical shape, the grooves can extend to the end. As a result, an effective area can be increased compared with a pipe having a flat end portion, thereby improving the performance as a heat pipe.

What is claimed is:

1. A heat pipe type cooling apparatus for a semiconductor, comprising:
    a plurality of first metal pipes which extend substantially parallel to each other, and one end of each of which is open, each of said first metal pipes having a plurality of first grooves formed in an inner surface thereof, each of said first grooves extending into said first metal pipes in the thickness direction of said first metal pipes and having a bottom portion within the thickness of said first metal pipes, each of said first grooves having an opening at the innermost surface of said first metal pipes which is broader than an interior portion of said first grooves;
    a plurality of second metal pipes which extend substantially parallel to each other, one end of each of which is closed to provide a closed-end system and the other end of each of which is open, each of said second metal pipes having a plurality of second grooves formed in an inner surface thereof, each of said second grooves extending into said second metal pipes in the thickness direction of said second metal pipes and having an inner and bottom portion within the thickness of said second metal pipes, each of said second grooves having an opening at the innermost surface of said second metal pipes which is narrower than the inner portion of said second grooves;
    an electrically insulating working liquid received in said first and second metal pipes;
    a plurality of electrically insulating pipes, each connecting said one open end of said first metal pipes to said other open end of a corresponding one of said second metal pipes so as to allow the interiors of said first and second metal pipes to communicate with each other, each of said first and second metal pipes, each of said electrically insulating pipes and said electrically insulating working liquid comprising a closed-end heat pipe assembly; and
    a conductive block to which said one closed end of each of said second metal pipes is connected, said conductive block having a receiving surface for directly receiving a semiconductor which is to be cooled thereon, without any intermediary between said receiving surface and said semiconductor which is to be cooled.

2. An apparatus according to claim 1, further comprising a plurality of fins connected to said first metal pipes for dissipating heat from said first metal pipes.

3. An apparatus according to claim 2, wherein the other end of each of said first metal pipes is tapered and formed into a hemispherical shape, and has a nozzle formed thereon.

4. An apparatus according to claim 2, wherein the other end of each of said first metal pipes is tapered and formed into a conical shape, and has a nozzle formed thereon.

5. An apparatus according to claim 1, wherein said first grooves formed in said first metal pipes are V-shaped grooves.

6. An apparatus according to claim 5, wherein said second grooves formed in said second metal pipes are partially circular grooves.

7. An apparatus according to claim 1, wherein said second grooves formed in said second metal pipes are partially circular grooves.

8. An apparatus according to claim 1, wherein said heat pipe assembly includes a vibration damping member formed substantially midway along a longitudinal direction of said heat pipe assembly.

9. An apparatus according to claim 6, wherein said said vibration damping member is coupled to said first metal pipe, and includes a bellowslike portion constituting part of said first metal pipe.

10. An apparatus according to claim 9, wherein said damping member includes a plurality of said bellowslike portions, each coupled to a respective first metal pipe.

11. An apparatus according to claim 10, wherein said bellowslike portions are made of the same material as that of said first metal pipes, and are integrally formed therewith.

12. An apparatus according to claim 7, wherein said bellowslike portion is made of the same material as that of said first metal pipe, and is integrally formed therewith.

13. A heat pipe type cooling apparatus for a semiconductor, comprising:
    a plurality of first pipes made of cooper, one end of each of which is open, each of said first pipes having a plurality of first V-shaped grooves formed in an inner surface thereof and arranged in a circumferential direction thereof, said V-shaped grooves extending into said first pipes in the thickness direction of said first pipes and having the widest portions of said V-shaped grooves at the inner surface of said first pipes;
    a plurality of second pipes made of an element selected from the group consisting of aluminum and copper, one end of each of which is closed to provide a closed-end system and the other end of each of which is open, each of said second pipes having a plurality of second grooves formed in an inner surface thereof, each of said second grooves extending into said second pipes in the thickness direction of said second pipes and having an inner and bottom portion within the thickness of said second pipes, each of said second grooves having an opening at the innermost surface of said second pipes which is narrower than the inner portion of said second grooves;

an electrically insulating working liquid provided in said first and second pipes;

a plurality of ceramic pipes arranged between said one open end of each of said first pipes and said other open end of a corresponding one of said second pipes;

a plurality of intermediate pipes made of an element selected from the group consisting of Koval and a nickel-iron alloy, and respectively coupled between at least one end of said ceramic pipes and at least one of said first and second pipes, said working liquid, each of said ceramic pipes, and each of said intermediate pipes comprising a closed-end heat pipe assembly; and a conductive block having an end face in which said one closed end of each of said second heat pipes is inserted, and said conductive block having a receiving surface for directly receiving a semiconductor which is to be cooled thereon, without any intermediary between said receiving surface and said semiconductor which is to be cooled.

14. An apparatus according to claim 9, wherein said first pipe includes a bellowslike vibration damping portion formed near said intermediate pipe.

15. An apparatus according to claim 13, wherein said intermediate pipes are coupled to each end of said ceramic pipes, between said ceramic pipes and said first and second pipes, respectively.

16. A heat pipe type cooling apparatus for a semiconductor, comprising:

a plurality of first metal pipes which extend substantially parallel to each other, and one end of each of which is open, each of said first metal pipes having a plurality of first grooves formed in an inner surface thereof, each of said first grooves extending into said first metal pipes in the thickness direction of said first metal pipes and having a bottom portion within the thickness of said first metal pipes, each of said first grooves having an opening at the innermost surface of said first metal pipes which is broader than an interior portion of said first grooves;

a plurality of second metal pipes which extend substantially parallel to each other, one end of each of which is closed to provide a closed-end system and the other end of each of which is open, each of said second metal pipes having a plurality of second and third grooves formed in an inner surface thereof to form boiling cores, each of said second and third grooves being generally V-shaped and extending into said second metal pipes in the thickness direction of said second metal pipes having an opening at the inner most surface of said second metal pipes which is broader than an inner part of the respective second and third grooves thereof, said second grooves extending in a first direction and said third grooves extending in a second direction so as to cross or intersect with said second grooves, whereby said first and second grooves which are crossed or intersect with one another form a large number of small recesses so that a number of boiling cores defined by said intersecting second and third grooves are increased;

an electrically insulating working liquid received in said first and second metal pipes;

a plurality of electrically insulating pipes, each connecting said one open end of each of said first metal pipes to said other closed end of a corresponding one of said second metal pipes so as to allow the interiors of said first and second metal pipes to communicate with each other, each of said first and second metal pipes, each of said electrically insulating pipes and said electrically insulating working liquid comprising a closed heat pipe assembly; and a conductive block to which said one closed end of each of said second metal pipes is connected, and said conductive block having a receiving surface for directly receiving a semiconductor which is to be cooled thereon, without any intermediary between said receiving surface and said semiconductor which is to be cooled.

* * * * *